United States Patent
Yu et al.

(10) Patent No.: US 9,645,200 B2
(45) Date of Patent: May 9, 2017

(54) BATTERY POWER MEASURING METHOD, MEASURING DEVICE AND BATTERY-POWERED EQUIPMENT

(71) Applicant: Silergy Semiconductor Technology (Hangzhou) LTD, Hangzhou, ZheJiang Province (CN)

(72) Inventors: Feng Yu, Hangzhou (CN); Xiaodong Huang, Hangzhou (CN); Hejinsheng Cao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 706 days.

(21) Appl. No.: 14/082,984

(22) Filed: Nov. 18, 2013

(65) Prior Publication Data
US 2014/0163910 A1    Jun. 12, 2014

(30) Foreign Application Priority Data
Dec. 11, 2012 (CN) .......................... 2012 1 0537717

(51) Int. Cl.
*G01R 31/36* (2006.01)
(52) U.S. Cl.
CPC ....... *G01R 31/3648* (2013.01); *G01R 31/362* (2013.01)
(58) Field of Classification Search
CPC .................................. G01R 31/3648
USPC ......................................... 702/63
See application file for complete search history.

(56) References Cited

U.S. PATENT DOCUMENTS

| | | | |
|---|---|---|---|
| 7,531,989 B2 | 5/2009 | Maireanu | |
| 7,557,584 B2 | 7/2009 | Murakami et al. | |
| 7,808,244 B2 | 10/2010 | Barsukov et al. | |
| 2006/0276981 A1* | 12/2006 | Aridome | G01R 31/3648 702/64 |
| 2009/0033292 A1* | 2/2009 | Majima | G01R 31/3675 320/153 |
| 2011/0161025 A1* | 6/2011 | Tomura | G01R 31/3651 702/63 |
| 2012/0121952 A1* | 5/2012 | Majima | G01R 31/3679 429/90 |
| 2012/0306450 A1* | 12/2012 | Nakayama | G06F 1/263 320/134 |

* cited by examiner

*Primary Examiner* — Ricky Ngon
(74) *Attorney, Agent, or Firm* — Michael C. Stephens, Jr.

(57) ABSTRACT

Disclosed herein are various battery power measurement devices, methods, and related apparatuses. In one embodiment, a method of measuring a battery power can include: (i) detecting a voltage and a temperature at an output terminal of a battery; (ii) obtaining a first correction coefficient based on a battery open-circuit voltage at a previous sample time; (iii) obtaining a second correction coefficient based on the battery temperature; (iv) calculating a real-time battery open-circuit voltage by using the voltage at the output terminal of the battery, the first and second correction coefficients, the battery open-circuit voltage at the previous sample time, and a time interval between the previous sample time and a present sample time; and (v) converting the real-time battery open-circuit voltage into a battery power measurement for display.

9 Claims, 6 Drawing Sheets

BATTERY POWER MEASURING METHOD, MEASURING DEVICE AND BATTERY-POWERED EQUIPMENT

RELATED APPLICATIONS

This application claims the benefit of Chinese Patent Application No. 201210537717.0, filed on Dec. 11, 2012, which is incorporated herein by reference in its entirety.

FIELD OF THE INVENTION

The present invention relates to the field of battery-powered equipment, and more particularly to battery power measuring methods and devices.

BACKGROUND

In current mobile phones, laptops, and other portable electronic devices, determining a state of charge (SOC) of the battery (e.g., a lithium battery) is important in the common usage of the devices. An SOC measurement can allow the user to have an objective understanding towards remaining power, and also to adjust usage patterns as may be necessary to prolong the power.

SUMMARY

In one embodiment, a method of measuring a battery power can include: (i) detecting a voltage and a temperature at an output terminal of a battery; (ii) obtaining a first correction coefficient based on a battery open-circuit voltage at a previous sample time; (iii) obtaining a second correction coefficient based on the battery temperature; (iv) calculating a real-time battery open-circuit voltage by using the voltage at the output terminal of the battery, the first and second correction coefficients, the battery open-circuit voltage at the previous sample time, and a time interval between the previous sample time and a present sample time; and (v) converting the real-time battery open-circuit voltage into a battery power measurement for display.

In one embodiment, a battery power measuring device can include: (i) a detection device configured to detect a voltage and a temperature at an output terminal of a battery; (ii) a storage device configured to store a first correction coefficient corresponding to a battery open-circuit voltage at a previous sample time, and a second correction coefficient corresponding to the temperature; (iii) a calculation device configured to calculate a real-time battery open-circuit voltage based on the voltage at the output terminal of the battery, the first and second correction coefficients, the battery open-circuit voltage at the previous sample time, and a time interval between the previous sample time and a present sample time; and (iv) a display device configured to convert the real-time battery open-circuit voltage to a battery power measurement for display.

In one embodiment, an apparatus can include: (i) the battery power measuring device as above; (ii) a charging power supply configured to charge the battery; and (iii) electrical equipment configured to receive power from the battery. Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In one example approach to measuring battery power of electronic devices, the voltage of a battery output terminal can be divided into different intervals. These different intervals may be utilised to correspondingly display different power, through a relationship between the battery voltage and the power to calculate the remaining battery power. However, the relationship between battery voltage and the power may not be an absolute correspondence, and may also be influenced by the discharge current and operating temperature. Thus in some cases, an error indication, false alarm, and/or error shutdown can occur or be provided.

Figure 1:
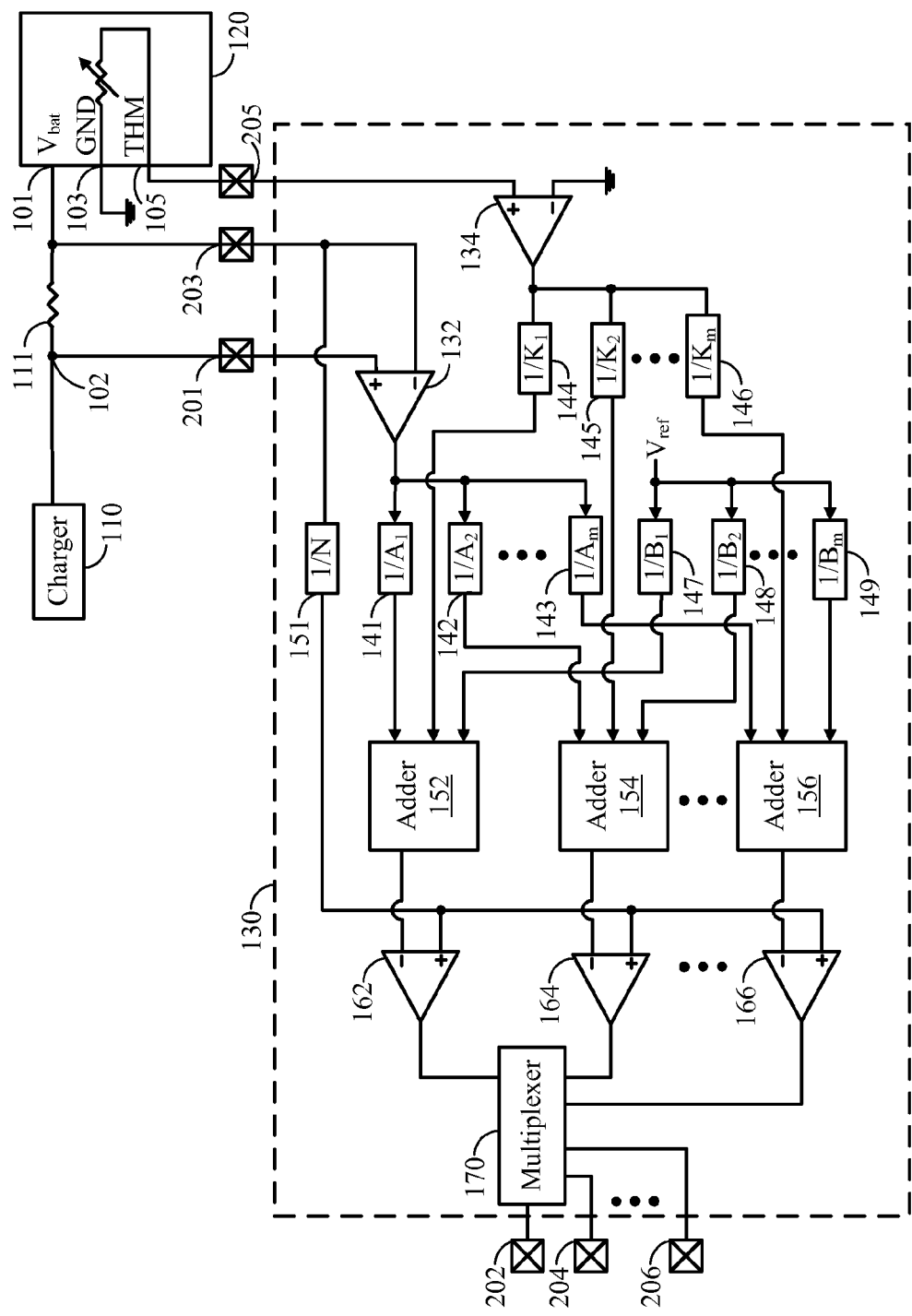
FIG. 1 is a schematic block diagram of an example battery power measuring circuit.

Referring now to FIG. 1, shown is a schematic block diagram of an example battery power measuring circuit. In this approach power charging into and from the battery can be calculated using a Coulomb gauge and impedance tracking approach, as well as other analog circuitry. In the battery power measuring circuit of FIG. 1, the discharging current and temperature of the battery pack can be detected, amplified by an amplifier circuit, and provided to a multiplexer unit for display after processing via a correction circuit and comparators. The correction circuit can include devices 141-149 and adders 152, 154, and 156, as well as other devices. Although the measuring circuit uses a variety of data models or forms, the structure of analog circuits can be very complex. Also, as the frequency of usage increases, the error of the Coulomb gauge may also increase. Further, a variety of measurements for the battery discharging current may produce cumulative error that can affect the accuracy of the battery power measurement.

In this example, an operating voltage can be generated to source an external application system at node 102 based on the remaining energy in the battery pack 120. Battery fuel gauge circuit 130 can detect the amount of the remaining energy in battery pack 120. Also, battery fuel gauge circuit 130 can implement discharge current correction and battery temperature correction to signals from battery pack 120 in order to accurately predict a remaining battery capacity. Charger 110 can charge battery pack 120 for sufficient power to source the external application system, and sense resistor 120 can measure the charge current. Charger 110 can be external to, or included within, battery pack 120.

Rechargeable battery pack 120 can include a number of rechargeable battery cells coupled in serial or in parallel. Battery pack 120 can include, pins 101, 103, and 105. Pin 101 can be coupled to a sense resistor 111, and may output a discharge current flowing through sense resistor 111 based upon a battery voltage of battery pack 120. When battery pack 120 operates in a discharge mode after being charged, the battery voltage at pin 101 can continue to decrease to a smaller value. Pin 103 can be coupled to ground. Since the temperature of the battery pack 120 may vary during charging or discharging, an internal battery thermistor can be included in battery pack 120 to measure variable temperatures of the rechargeable battery cells. Battery pack 120 can generate a voltage signal based on the temperature measurement, and pin 105 can output a voltage signal indicating temperature aspects of the rechargeable battery cells.

Battery fuel gauge circuit 130 can include input pins 201, 203, and 205, and output pins 202, 204, and 206. Pins 201 and 203 can be coupled to two ends of resistor 111, and circuit 130 can receive a voltage differential between pins 201 and 203. The voltage differential can equal a discharge current multiplied by the resistance of resistor 111. Because pin 205 is connected to pin 105 of battery pack 120, it can receive a voltage signal indicating the variable temperature measured by the battery thermistor within battery pack 120. Battery fuel gauge circuit 130 can also include current sense amplifier (CSA) 132, temperature amplifier (TA) 134, a correction unit, comparators 162, 164, and 166, and multiplexer 170. CSA 132 can monitor a voltage across the resistor 111, and output an amplified voltage. TA 134 can monitor a voltage signal from pin 105, and may generate an amplified voltage based on thermal features of battery pack 120.

The correction circuit can include coefficient generators 141-149, and adders 152, 154, and 156. The coefficient generators can provide various coefficients to satisfy requirements from different users, and the various coefficients can correct errors or variance in the signals from battery pack 120. After receiving an amplified voltage from CSA 132, coefficient generators 141, 142, and 143 can multiply the amplified voltage by corresponding coefficients, and send the corrected voltages to adders 152, 154, and 156. Coefficient generators 144, 145, and 146 can receive an amplified voltage from the TA 134, multiply the amplified voltage by corresponding coefficients, and generate the corrected voltages for adders 152, 154, and 156. Coefficient generators 147, 148, and 149 can receive a reference voltage that may be generated by battery fuel gauge circuit 130, multiply the reference voltage by corresponding coefficients, and then output corrected reference voltages to adders 152, 154, and 156.

Adder 152 can output a sum to a non-inverting input terminal of the comparator 162, where the sum is a threshold voltage for the comparator 162. Similarly, adder 154 can generate a sum to comparator 164, and adder 156 can provide a sum to comparator 166. The correction unit can also include coefficient generator 151 that can provide a coefficient equal to one divided by the total number of the battery cells in battery pack 120. This coefficient can be multiplied by the battery voltage of the battery pack 120 such that the battery voltage can be corrected, and the corrected battery voltage can be sent to comparators 162, 164, and 166. Comparators 162, 164 and 166 can respectively compare the divided value from coefficient generator 151 against the threshold voltages from adders 152, 154, and 156, and may output digital signals (1 or 0) to multiplexer 170. Multiplexer 170 can transmit the digital signals to an external circuit to display battery capacity via output pins 202, 204, and 206.

The state of charge (SOC) of the battery is commonly used to characterize the battery power, and to represent the remaining battery power or charge of the battery or battery pack. Any type of rechargeable batteries can be employed in particular embodiments. For example, rechargeable batteries can include alkaline batteries (e.g., nickel cadmium [Ni—Cd], nickel metal hydride [Ni-MH] batteries, etc), as well as lithium ion (Li-ion) batteries that are suitable for portable electronic appliances because they exhibit high energy density, low temperature characteristics, and stable storage capability.

Figure 2:
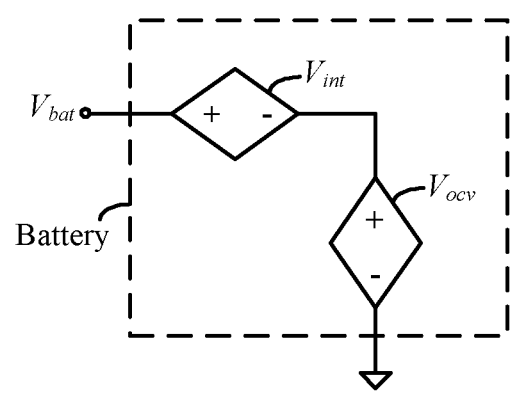
FIG. 2 shows an example equivalent circuit model of the battery.

However, the SOC of the battery can be influenced by an internal voltage drop of the battery, in addition to power consumption of the electrical device that is being supplied by the battery. The internal voltage drop of the battery typically correlates with variations of the battery temperature and the battery open-circuit voltage. FIG. 2 shows an example equivalent circuit model of the battery. The internal structure of the battery can be equivalent to two series connected controllable voltage sources: internal voltage drop $V_{int}$ of the battery and battery open-circuit voltage $V_{ocv}$.

Battery output voltage $V_{bat}$ can be expressed as the sum of the two controllable voltage sources. Thus, $V_{bat}=V_{int}+V_{ocv}$. The relationship between internal voltage drop $V_{int}$ of the battery and battery open-circuit voltage $V_{ocv}$ and the battery temperature can be expressed as shown below in equation (1) using correction coefficient $K_1$ and correction coefficient $K_2$. Correction coefficient $K_1$ may correlate with battery open-circuit voltage $V_{ocv}$, and correction coefficient $K_2$ may correlate with the battery temperature.

$$V_{int} = K_1 * K_2 * \frac{dV_{ocv}}{dt} \qquad (1)$$

Substituting equation (1) into the equation of the battery output voltage, the following relation relating to the battery open-circuit voltage $V_{ocv}$ can be obtained, as shown in equation (2).

$$V_{ocv} = V_{bat} - K_1 * K_2 * \frac{dV_{ocv}}{dt} \qquad (2)$$

By discretizing equation (2) based on sample times, equation (3) can be obtained as shown below.

$$V_{ocv}(k) = V_{bat}(k) - K_1 * K_2 * \frac{V_{ocv}(k) - V_{ocv}(k-1)}{\Delta t} \qquad (3)$$

For example, $\Delta t$ can represent a time interval between the $k_{th}$ sample time or moment or time point and the $(k-1)_{th}$ sample time. Equation (4) can be deduced as shown below.

$$V_{ocv}(k) = \frac{V_{bat}(k)\Delta t + K_1 K_2 V_{ocv}(k-1)}{\Delta t + K_1 K_2} \quad (4)$$

It can be seen from the above equations that, when real-time battery output voltage $V_{bat}$, battery open-circuit voltage $V_{ocv}(k-1)$ at the previous sample time, correction coefficients $K_1$ and $K_2$ (e.g., based on the battery temperature) are known, the real-time battery open-circuit voltage can be calculated.

In one embodiment, a method of measuring a battery power can include: (i) detecting a voltage and a temperature at an output terminal of a battery; (ii) obtaining a first correction coefficient based on a battery open-circuit voltage at a previous sample time; (iii) obtaining a second correction coefficient based on the battery temperature; (iv) calculating a real-time battery open-circuit voltage by using the voltage at the output terminal of the battery, the first and second correction coefficients, the battery open-circuit voltage at the previous sample time, and a time interval between the previous sample time and a present sample time; and (v) converting the real-time battery open-circuit voltage into a battery power measurement for display.

Figure 3:
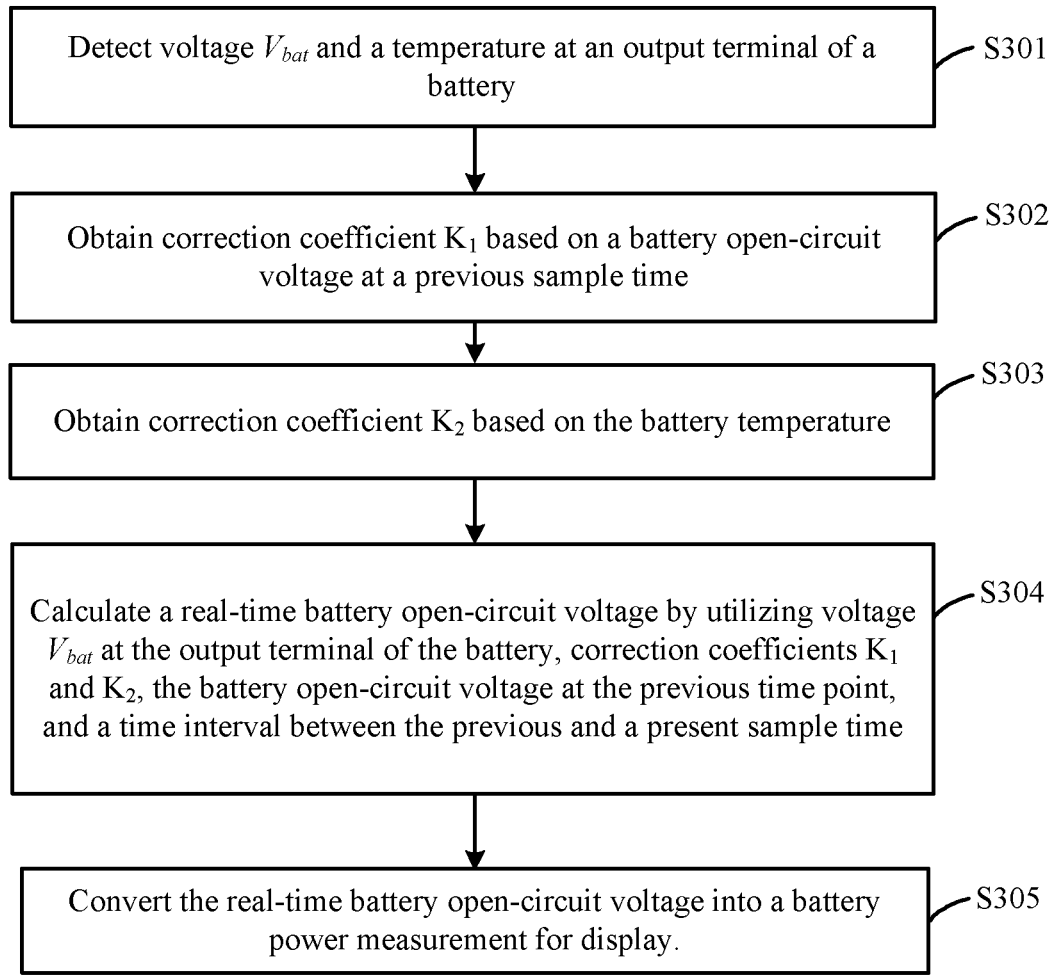
FIG. 3 is a flow diagram of an example battery power measuring method, in accordance with embodiments of the present invention.

Referring now to FIG. 3, shown is a flow diagram of an example battery power measuring method, in accordance with embodiments of the present invention. At S301, battery output voltage $V_{bat}$ and the battery temperature can be detected. For example, temperature sensing circuitry can be employed to determine the battery temperature at an output terminal thereof. At S302, correction coefficient $K_1$ based on the battery open-circuit voltage at a previous sample time can be obtained. For example, this voltage at the previous sample time can be stored in a storage device for access to determine correction coefficient $K_1$. At S303, correction coefficient $K_2$ based on the battery temperature can be obtained.

At S304, a real-time battery open-circuit voltage can be calculated by utilizing the battery output voltage, correction coefficients $K_1$ and $K_2$, the battery open-circuit voltage at the previous sample time, and a time interval between the previous and present sample times. One or more of these items can be retrieved from a storage device, detected in real time by a detection device or circuit, and/or calculated by a calculation device or circuit. At S305, the real-time battery open-circuit voltage can be converted to a battery power measurement for display. For example, the battery power measurement can be displayed as a percentage of the battery charge, where 100% can indicate a fully charged rechargeable battery.

For example, S304 may also include storing the calculated real-time battery open-circuit voltage for calculating the battery open-circuit voltage at a subsequent sample time. In this case, the calculated battery open-circuit voltage $V_{ocv}(k)$ at the $k_{th}$ sample time can be stored, and may be utilized to calculate battery open-circuit voltage $V_{ocv}(k+1)$ at the $(k+1)_{th}$ sample time. Thus, the battery open-circuit voltage at any given sample time can be calculated by the battery open-circuit voltage at a previous sample time. Also, the battery open-circuit voltage at an initial sample time can be equal to the initial battery output voltage.

Figure 4:
FIG. 4 shows a relationship curve of the open-circuit voltage and the battery power (OCV-SOC).

Because there is a certain relationship or correlation between the battery open-circuit voltage and the battery power, the OCV-SOC relationship curve can be obtained by testing or sampling the battery. FIG. 4 shows an example relationship curve of the open-circuit voltage (OCV) and the battery power or SOC. For example, data points or coefficients corresponding to such a curve can be accessed from and/or stored in a storage device (e.g., in table form). Thus, S305 may also include testing or sampling the battery, obtaining the relationship between the battery open-circuit voltage and the battery power, and storing the corresponding data in memory (e.g., in table form). The SOC value of the battery power can be obtained by accessing the table after obtaining the real-time battery open-circuit voltage through calculation.

In particular embodiments, a battery measuring method can also include testing or sampling the battery, obtaining the relationship between correction coefficient $K_1$ and the battery open-circuit voltage, as well as the relationship between correction coefficient $K_2$ and the battery temperature, and storing the corresponding data. In this way, in the process of calculation, correction coefficients $K_1$ and $K_2$ for real-time calculation can be obtained by accessing the stored data based on the battery open-circuit voltage and the detected battery temperature at the appropriate (or most recent) previous sample time.

In determining correction coefficients $K_1$ and $K_2$, various test or characterization methods can be employed in particular embodiments. For example, several batteries or cells in a same batch can be utilised with a same model, performance, parameter, and manufacturing process. The batteries may be placed in an incubator, and the battery charging and discharging voltage and current can be calculated and recorded through, e.g., a high accuracy multimeter. A statistical analysis of the recorded data can be performed to obtain the desired data for determining correction coefficients $K_1$ and $K_2$.

After the battery is left unused for a relatively long time in a "relaxed" state, and the battery is to be used again in a working state (e.g., charging or discharging), the battery power measurement may be calibrated. For example, whether differential value $$\frac{dV_{ocv}}{dt}$$

of battery open-circuit voltage $V_{ocv}$ is less than a predetermined threshold can be detected. For example, if in a predetermined period of time (e.g., from about 1.5 hours to about 3 hours), $$\frac{dV_{ocv}}{dt}$$

is less than the predetermined threshold, the battery pack may be detected as being in a relaxed state.

In other words, if the rate of change of the open-circuit voltage remains lower than the predetermined threshold value for a relatively long (predetermined) time, the battery is determined to have stopped changing, or to be in the relaxed state. In this case, the battery open circuit voltage can be set as equal to the battery output voltage ($V_{ocv}(k)= V_{bat}(k)$). In this way, measurement of the battery power can be calibrated, and the power measurement display accuracy can be improved at an initial sample time when battery operation changes from the relaxed state into a working state.

In particular embodiments, a battery power measuring approach may utilise substantially digital circuits. Such digital circuitry can perform a series of tests or samples on the battery by way of the battery equivalent model. In this way, a battery power can be obtained by detecting the battery output voltage and the operating temperature, and by performing various calculations using the digital circuitry. The overall battery power measurement circuit can be relatively simple, and may not need to detect battery discharging current in order to determine the battery power.

In one embodiment, a battery power measuring device can include: (i) a detection device configured to detect a voltage and a temperature at an output terminal of a battery; (ii) a storage device configured to store a first correction coefficient corresponding to a battery open-circuit voltage at a previous sample time, and a second correction coefficient corresponding to the temperature; (iii) a calculation device configured to calculate a real-time battery open-circuit voltage based on the voltage at the output terminal of the battery, the first and second correction coefficients, the battery open-circuit voltage at the previous sample time, and a time interval between the previous sample time and a present sample time; and (iv) a display device configured to convert the real-time battery open-circuit voltage to a battery power measurement for display. Also, an apparatus can include: (i) the battery power measuring device as above; (ii) a charging power supply configured to charge the battery; and (iii) electrical equipment configured to receive power from the battery.

Figure 5:
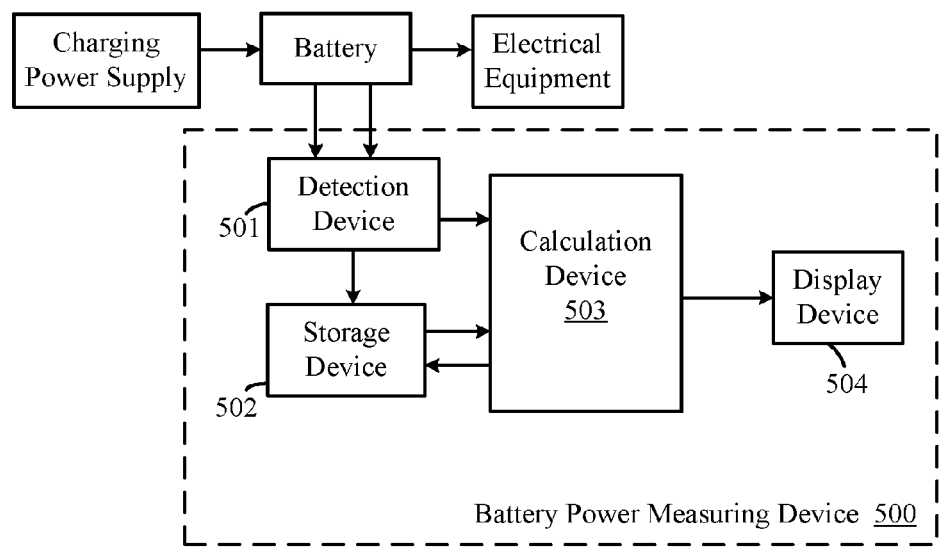
FIG. 5 is a block diagram of an example battery power measuring device in accordance with embodiments of the present invention.

Referring now to FIG. 5, shown is a block diagram of an example battery power measuring device in accordance with embodiments of the present invention. In this particular example, battery power measuring device 500 can include detection device 501 configured to detect battery output voltage $V_{bat}$ and the battery temperature. Storage device 502 may be used to store correction coefficient $K_1$ corresponding to a battery open-circuit voltage at a previous sample time, and correction coefficient $K_2$ corresponding to the battery temperature. Storage device 502 can include any non-volatile (e.g., flash memory, etc.) or volatile (e.g., SRAM, DRAM, etc.) type of memory.

Calculation device or circuit 503 can receive battery output voltage $V_{bat}$ provided by detection device 501. Calculation device 503 can calculate a real-time battery open-circuit voltage based on correction coefficients $K_1$ and $K_2$, the battery open-circuit voltage at the previous sample time, and a time interval between the previous and a present sample time. For example, one or more of detection device 501, storage device 502, and calculation device 503, can be an integrated circuit. Display device 504 may convert the real-time battery open-circuit voltage to the battery power measurement for display (e.g., on a display screen). Display screen 504 can include a touchscreen (e.g., for a smart phone, portable computing device, etc.), and the battery power measurement can be displayed as a percentage of charge capacity, or as any other suitable icon.

For example, calculation device 503 and storage device 502 can realize two-way data transmission, and calculation device 503 can transmit the calculated real-time battery open-circuit voltage data to storage device 502 for storage. Also, the data can be transmitted to calculation device 503 through storage device 502 when calculating the battery open-circuit voltage at a subsequent or following sample time.

Display device 504 can also be connected to storage device 502, and storage device 502 can store the corresponding data (e.g., OCV-SOC relationship curve) characterizing the relationship of the battery open-circuit voltage and battery power obtained by testing the battery. The data can be provided to display device 504, so as to convert the battery open-circuit voltage to the battery power measurement. Further, storage device 502 can store data characterizing the relationship between the battery open-circuit voltage and correction coefficient $K_1$, and the relationship between the battery temperature and correction coefficient $K_2$ obtained by testing the battery. For example, the data can be stored in the form of a table, and can be accessed to provide calculation parameters for calculation device 503.

Figure 6:
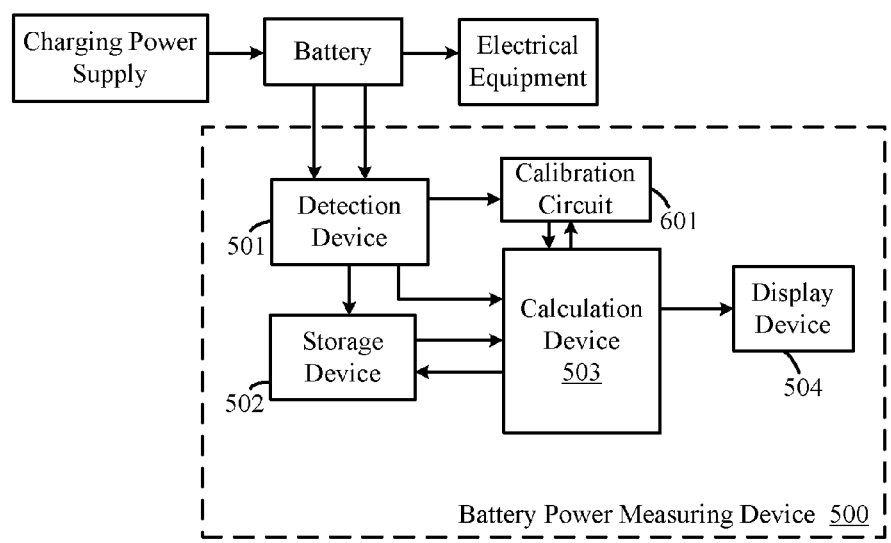
FIG. 6 is a block diagram of another example battery power measuring device in accordance with embodiments of the present invention.

Referring now to FIG. 6, shown is a block diagram of another example battery power measuring device in accordance with embodiments of the present invention. In this example, calibration circuit 601 can be coupled to detection device 501 and calculation device 503. Calibration circuit 601 can be utilized to calibrate the battery power when the battery begins to operate or be used again after being left unused for a relatively long time (e.g., in the relaxed state). Calibration circuit 601 can be integrated within one or more of detection device/circuit 501, storage device/circuit 502, and calculation device/circuit 503, or may be a standalone circuit.

Calibration circuit 601 can determine whether the battery is in the relaxed state based on a changing rate of the battery open-circuit voltage. For example, if the changing rate of the open-circuit voltage is lower than a predetermined threshold value for a predetermined (e.g., relatively long) time, the battery or battery pack can be determined to be in the relaxed state. In this case, calibration circuit 601 can set the battery open-circuit voltage output by calculation device 503 to be equal to the battery output voltage ($V_{ocv}(k)=V_{bat}(k)$) based on the battery output voltage provided by detection device 501. In this way, measurement of the battery power can be calibrated upon the battery transitioning from the relaxed state to a working state, in order to provide accuracy and continuity in the power measurement display.

In particular embodiments, a battery-powered device can include a charging power supply, a battery, electrical equipment, and a battery power measuring device, as described above. The charging power supply can charge the battery to provide power to the electrical equipment (e.g., a smart phone, portable computing device, etc.), and the battery power measuring device can be used to measure and display the battery power (e.g., via a percentage of the battery charge capability).

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A method of measuring a battery power, the method comprising:
   a) detecting, by a detection device, a voltage and a temperature at an output terminal of a battery;
   b) obtaining, from a storage device coupled to said detection device, a first correction coefficient based on a battery open-circuit voltage at a previous sample time;
   c) obtaining, from said storage device, a second correction coefficient based on said battery temperature;
   d) calculating, by a calculation device coupled to said detection device and said storage device, a real-time battery open-circuit voltage by using said voltage at said output terminal of said battery, said first and second correction coefficients, said battery open-circuit voltage at said previous sample time, and a time interval between said previous sample time and a present sample time;

e) converting, by a display device coupled to said calculation device, said real-time battery open-circuit voltage into a battery power measurement for display;

f) determining, by a calibration circuit coupled to said detection device and said calculation device, if said battery is in a relaxed state based on a changing rate of said real-time battery open-circuit voltage; and g) setting, by said calibration circuit, said real-time battery open-circuit voltage to be equal to said voltage at said output terminal of said battery when said battery is in said relaxed state.

2. The method of claim 1, further comprising storing said real-time battery open-circuit voltage for calculating a subsequent battery open-circuit voltage.

3. The method of claim 1, further comprising:
a) detecting said battery; and
b) determining a relationship between said battery open-circuit voltage and said battery power measurement.

4. The method of claim 1, further comprising:
a) detecting said battery;
b) determining a relationship between said first correction coefficient and said battery open-circuit voltage; and
c) determining a relationship between said second correction coefficient and said battery temperature.

5. A battery power measuring device, comprising:
a) a detection device configured to detect a voltage and a temperature at an output terminal of a battery;
b) a storage device coupled to said detection device, wherein said storage device is configured to store a first correction coefficient corresponding to a battery open-circuit voltage at a previous sample time, and a second correction coefficient corresponding to said temperature;
c) a calculation device coupled to said detection device and said storage device, wherein said calculation device is configured to calculate a real-time battery open-circuit voltage based on said voltage at said output terminal of said battery, said first and second correction coefficients, said battery open-circuit voltage at said previous sample time, and a time interval between said previous sample time and a present sample time;

d) a display device coupled to said calculation device, wherein said display device is configured to convert said real-time battery open-circuit voltage to a battery power measurement for display; and e) a calibration circuit coupled to said detection device and said calculation device, wherein said calibration circuit is configured to determine if said battery is in a relaxed state based on a changing rate of said real-time battery open-circuit voltage, and to set said real-time battery open-circuit voltage to be equal to said voltage at said output terminal of said battery when said battery is in said relaxed state.

6. The battery power measuring device of claim 5, wherein said storage device is configured to store said real-time battery open-circuit voltage to calculate a subsequent battery open-circuit voltage.

7. The battery power measuring device of claim 5, wherein said storage device is configured to store data characterizing a relationship between said real-time battery open-circuit voltage and said battery power measurement.

8. The battery power measuring device of claim 5, wherein said storage device is configured to store:
a) data characterizing a relationship between said real-time battery open-circuit voltage and said first correction coefficient; and
b) data characterizing a relationship between said temperature and said second correction coefficient.

9. An apparatus, comprising:
a) said battery power measuring device of claim 5;
b) a charging power supply configured to charge said battery; and
c) electrical equipment configured to receive power from said battery.

* * * * *